(12) United States Patent
Benabdelaziz et al.

(10) Patent No.: US 10,659,041 B2
(45) Date of Patent: May 19, 2020

(54) CONTROL OF AN ANODE-GATE THYRISTOR

(71) Applicant: STMicroelectronics (Tours) SAS, Tours (FR)

(72) Inventors: Ghafour Benabdelaziz, Tours (FR); Romain Pichon, Reugny (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 16/240,409

(22) Filed: Jan. 4, 2019

(65) Prior Publication Data
US 2019/0214985 A1 Jul. 11, 2019

(30) Foreign Application Priority Data
Jan. 5, 2018 (FR) .................... 18 50069

(51) Int. Cl.
| | |
|---|---|
| *H02M 1/08* | (2006.01) |
| *H02M 1/32* | (2007.01) |
| *H03K 17/725* | (2006.01) |
| *H02M 7/15* | (2006.01) |
| *H03K 17/72* | (2006.01) |
| *H02M 7/162* | (2006.01) |
| *H03K 17/10* | (2006.01) |

(52) U.S. Cl.
CPC .......... *H03K 17/725* (2013.01); *H02M 7/151* (2013.01); *H02M 7/1623* (2013.01); *H03K 17/102* (2013.01); *H03K 17/72* (2013.01)

(58) Field of Classification Search
CPC .... H03K 17/725; H03K 17/602; H03K 17/72; H02M 7/1623
See application file for complete search history.

(56) References Cited

U.S. PATENT DOCUMENTS

| | | | |
|---|---|---|---|
| 9,525,361 B2 | 12/2016 | Gonthier | |
| 10,298,143 B2* | 5/2019 | Benabdelaziz | H02M 1/32 |
| 2017/0170746 A1* | 6/2017 | Benabdelaziz | H02M 1/32 |

FOREIGN PATENT DOCUMENTS

EP 3182571 A1 6/2017

OTHER PUBLICATIONS

INPI Search Report and Written Opinion for FR 1850069 dated Aug. 21, 2018 (6 pages).

\* cited by examiner

*Primary Examiner* — Kenneth B Wells
(74) *Attorney, Agent, or Firm* — Crowe & Dunlevy

(57) ABSTRACT

A circuit for controlling an anode-gate thyristor includes a first transistor that couples a thyristor gate to a first terminal to receive a potential lower than a potential of a second terminal connected to the thyristor anode. A control terminal of the first transistor is driven by a control signal which is positive with respect to the potential of the first terminal.

24 Claims, 5 Drawing Sheets

CONTROL OF AN ANODE-GATE THYRISTOR

PRIORITY CLAIM

This application claims the priority benefit of French Application for Patent No. 1850069, filed on Jan. 5, 2018, the content of which is hereby incorporated by reference in its entirety to the maximum extent allowable by law.

TECHNICAL FIELD

The present disclosure generally relates to electronic circuits and, more specifically, to the control of thyristor-type power switches. The present disclosure more particularly applies to the control of a thyristor connected to an AC voltage, such as the control of an AC load or the control of a thyristor of a controllable rectifying bridge.

BACKGROUND

The control of a thyristor-type or triac-type power switch requires extracting or injecting a current from or into the gate thereof. The generation of this current may involve using a specific circuit to generate a current galvanically isolated from upstream circuits, which operate under a different voltage or with a different potential reference. This is particularly true in power applications where the switch controls an AC load or is connected to terminals of an AC voltage, as is the case for a rectifying bridge.

Other applications avoid an insulation transformer at the cost of utilizing a pulse control of the thyristors. For example, U.S. Pat. No. 9,525,361 (incorporated by reference) describes a rectifying bridge having two anode-gate thyristors provided in the lower portion of the bridge, that is, with the anodes connected to the most negative potential of the rectified voltage (typically, a reference potential or ground).

SUMMARY

It is an aim of embodiments of the present description to at least partially address one or more previously unaddressed issues.

An embodiment overcomes all or part of the disadvantages of thyristor control circuits.

An embodiment provides an approach avoiding using an isolation transformer or an optocoupler.

An embodiment provides an approach avoiding a pulse control of the thyristors.

An embodiment provides an approach particularly adapted to the control of an anode-gate thyristor.

An embodiment provides an approach particularly adapted to the control of an AC load by an anode-gate thyristor.

An embodiment provides an approach particularly adapted to the control of anode-gate thyristors of a controllable rectifying bridge.

Thus, an embodiment provides a circuit for controlling an anode-gate thyristor. The circuit includes a first transistor coupling the thyristor gate to a first terminal applying a potential lower than the potential of a second terminal having the thyristor anode connected thereto, and a control terminal of the first transistor is intended to receive a control signal which is positive with respect to the potential of the first terminal.

According to an embodiment, the control terminal of the first transistor is coupled, by a second transistor, to a third terminal for supplying a potential which is positive with respect to the potential of the second terminal.

According to an embodiment, the third and first terminals are intended to receive a DC voltage.

According to an embodiment, the second transistor is controlled by a signal referenced to the potential of the second terminal.

According to an embodiment, the second transistor is directly controlled by a microcontroller powered between the third and second terminals.

According to an embodiment, the second transistor is controlled by a circuit for detection of the direction of the halfwave of an AC voltage applied across the thyristor.

According to an embodiment, the second transistor is a bipolar transistor.

An embodiment provides a rectifying bridge comprising at least one anode-gate thyristor and at least one control circuit.

According to an embodiment, the rectifying bridge comprises two anode-gate thyristors, each associated with a first transistor and with a second transistor.

An embodiment provides a circuit for controlling an AC load comprising an anode-gate thyristor and a control circuit.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
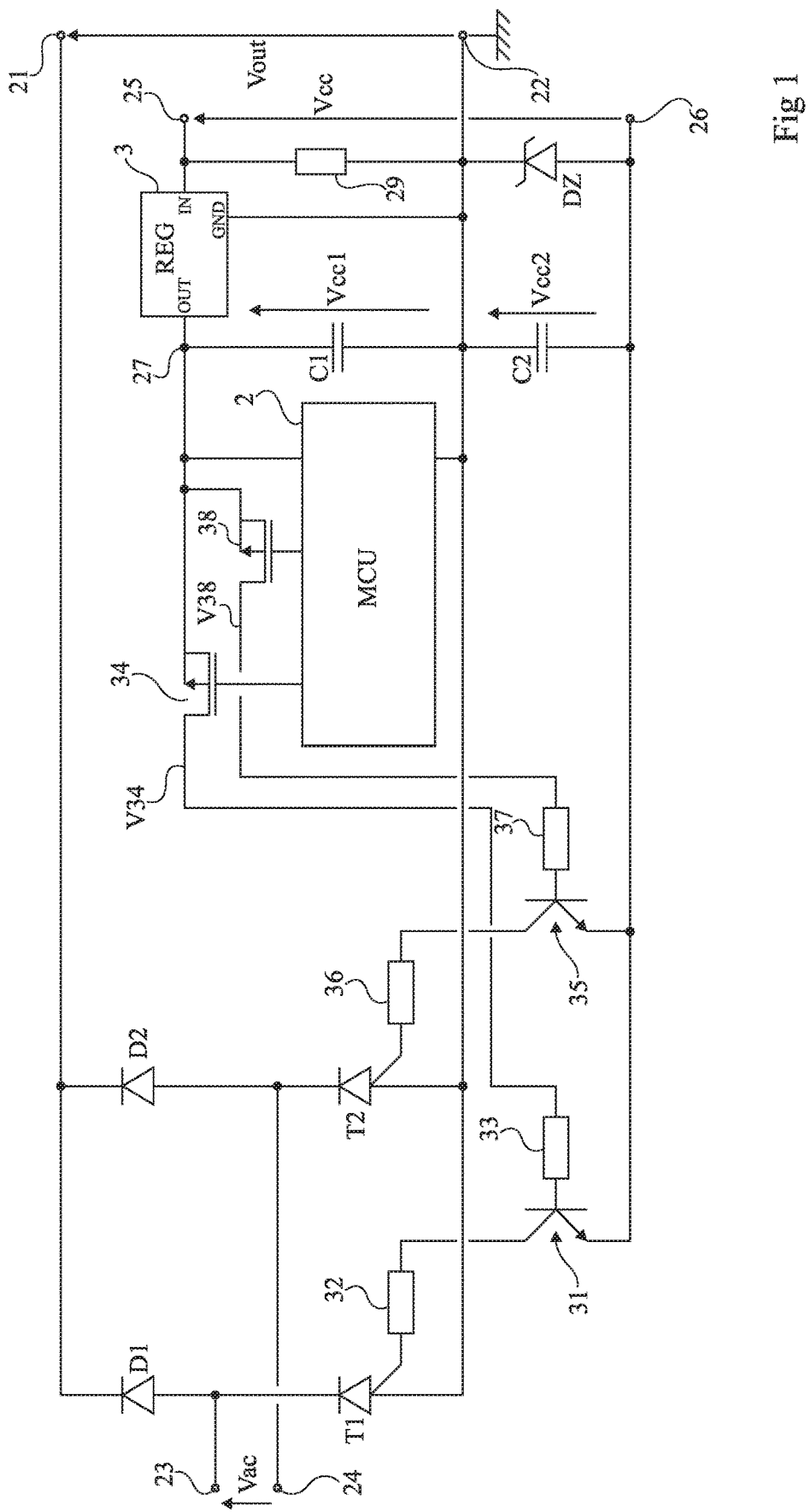
FIG. 1 is a simplified representation, partially in the form of blocks, of an embodiment of a controllable rectifying circuit comprising anode-gate thyristors.

The same elements have been designated with the same reference numerals in different drawings.

For clarity, only those steps and elements which are useful to the understanding of the embodiments which will be described have been shown and will be detailed. In particular, the applications of the described rectifying bridge or of the controlled AC load have not been detailed, the described embodiments being compatible with usual applications and loads for which a controllable rectifying bridge or a thyristor are desired to be used to control an AC load. The generation of the thyristor control orders according to the needs of the load or to other criteria relating to the application has not been detailed either, the described embodiments being here again compatible with known techniques.

Throughout the present disclosure, the term "connected" is used to designate a direct electrical connection between circuit elements, whereas the term "coupled" is used to designate an electrical connection between circuit elements that may be a direct electrical connection, or may be connected via one or more intermediate elements such as resistors, capacitors, transistors or buffers. Unless indicated otherwise, when the term "coupled" is used, the connection can be implemented by a direct connection.

The terms "approximately", "about", and "on the order of" are used herein to designate a tolerance of plus or minus 10%, and preferably of plus or minus 5%, of the value in question.

FIG. 1 is a simplified representation, partially in the form of blocks, of an embodiment of a controllable rectifying bridge comprising anode-gate thyristors.

This rectifying bridge comprises two parallel branches between two terminals 21 and 22 delivering a rectified voltage Vout. Each branch comprises a diode D1, D2, connected to a thyristor T1, T2, between terminals 21 and 22, the thyristor anodes being connected to terminal 22 and the diode cathodes being connected to terminal 21. The respective midpoints of the two branches define terminals 23 and 24 to which the AC voltage Vac to be rectified is applied, terminal 23 being coupled to the anode of diode D1 and to the cathode of thyristor T1, terminal 24 being coupled to the anode of diode D2 and to the cathode of thyristor T2. Thyristor T2 is intended to be turned on during all or part of the positive halfwaves of voltage Vac. Thyristor T1 is intended to be turned on during all or part of the negative halfwaves of voltage Vac. Thyristors T1 and T2 are anode-gate thyristors. They are thus turned on by extraction of a current from their gate.

In the embodiment of FIG. 1, signals for controlling thyristors T1 and T2 are produced by a digital circuit 2, for example, a microcontroller (MCU). Microcontroller 2 is powered with a DC voltage Vcc1 referenced to the system ground, that is, reference terminal 22 of rectified voltage Vout. Since this reference corresponds to the potential of the anodes of thyristors T1 and T2 and the thyristors are anode-gate thyristors, a potential lower than that of terminal 22 is used to extract the gate current.

According to the described embodiments, ground 22 is used as an intermediate potential between two DC voltages obtained from an auxiliary voltage source (not shown) supplying a DC voltage Vcc. Voltage Vcc is applied between two terminals 25 and 26, different from terminals 21, 22, 23, and 24. Voltage Vcc is used to supply voltage Vcc1 for powering circuit 2 and is used to supply a voltage Vcc2 having its most positive potential corresponding to ground 22. Thus, ground 22 is considered as an intermediate midpoint of voltage Vcc.

In the example of FIG. 1, terminal 25 is connected to input IN of a linear regulator 3 having an output terminal 27 OUT supplying the most positive potential of power supply voltage Vcc1 of microcontroller 2, and referenced to ground, and reference terminal GND of regulator 3 is coupled to terminal 22. A capacitor C1 connected between terminals 27 and 22 smooths voltage Vcc1. As a variation, regulator 3 is replaced with a Zener diode (not shown) connected between terminals 25 and 22. A capacitor C2 is connected between terminals 26 and 22.

To obtain voltage Vcc2, a Zener diode DZ is, for example, connected between terminals 22 and 26, its anode being on the side of terminal 26. A resistor 29 (typically of a few hundreds of ohms to avoid dissipating excess power) couples terminals 25 and 22. A capacitor connected between terminals 22 and 26 smooths voltage Vcc2.

A voltage Vcc1 for powering microcontroller 2, and a voltage −Vcc2 negative with respect to terminal 22 enabling drawing of a gate current from thyristors T1 and T2, are thus available.

For example, the gate of thyristor T1 is coupled to terminal 26 by an NPN-type bipolar transistor 31, the collector of transistor 31 being coupled, preferably by a protection resistor 32, to the gate of thyristor T1, and its emitter being connected to terminal 26. The base of transistor T1 is coupled, by a voltage-to-current conversion or biasing resistor 33 in series with a MOS transistor 34 (for example, a PMOS), to terminal 27. Transistor 34 is controlled by microcontroller 2 and has its source on the side of terminal 27. Thus, when microcontroller 2 switches the transistor 34 to the on state by applying to its gate a low digital level (potential lower than the potential of terminal 27), a current flows from terminal 27, through transistor 34 and through resistor 33. The base current applied to transistor 31 turns it on, which causes the extraction of a gate current from thyristor T1, causing it to be properly biased (positive anode-to-cathode voltage). The on state of thyristor T1 is maintained until the current flowing therethrough disappears, that is, on inversion of the biasing of voltage Vac.

Similarly, the gate of thyristor T2 is coupled to terminal 26 by an NPN-type bipolar transistor 35, the collector of transistor 35 being coupled, preferably by a protection resistor 36, to the gate of thyristor T2 and its emitter being connected to terminal 26. The base of transistor T2 is coupled, by a voltage-to-current conversion or biasing resistor 37 in series with a MOS transistor 38 (for example, a PMOS) to terminal 27. Transistor 38 is controlled by microcontroller 2 and has its source on the side of terminal 27. Thus, when microcontroller 2 turns the transistor 38 to the on state by applying to its gate a low digital level (potential lower than the potential of terminal 27), a current flows from terminal 27, through transistor 38, and through resistor 37. The base current applied to transistor 35 turns it on, which causes the extraction of a gate current from thyristor T1, causing it to be properly biased (positive anode-to-cathode voltage). The on state of thyristor T2 is maintained until the current flowing therethrough disappears, that is, on inversion of the biasing of voltage Vac.

FIGS. 2A, 2B, 2C, and 2D illustrate, in timing diagrams, the operation of the rectifying bridge of FIG. 1.

Figure 2A:
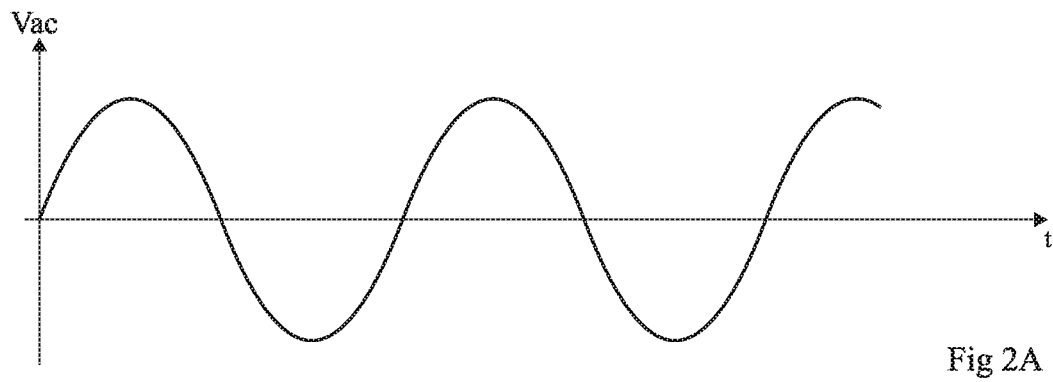
FIGS. 2A, 2B, 2C, and 2D illustrate, in timing diagrams, the operation of the rectifying bridge of FIG. 1.
Figure 2B:
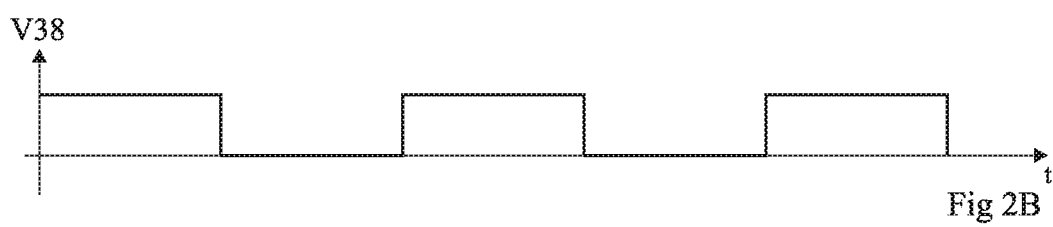
Figure 2C:
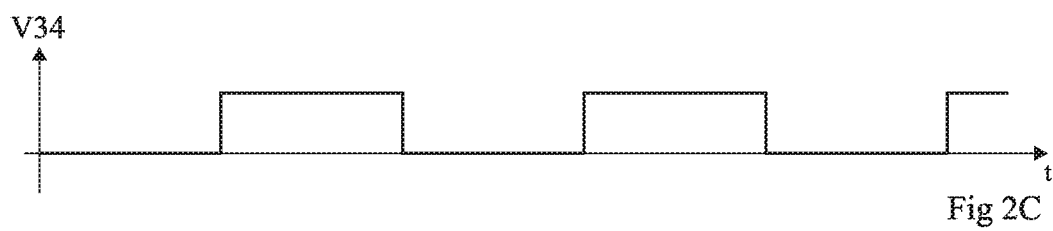
Figure 2D:
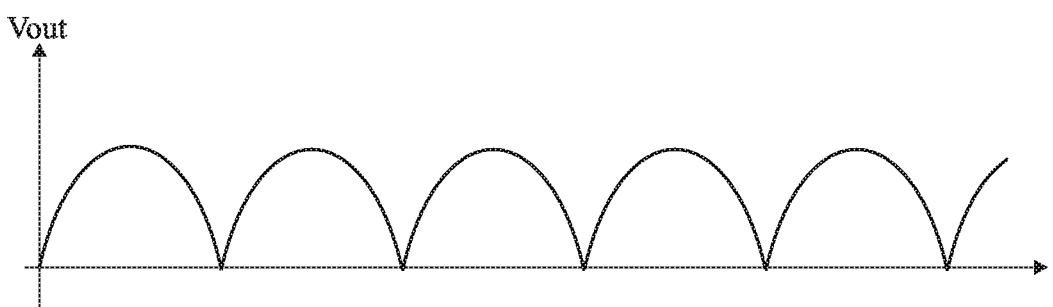

FIG. 2A shows an example of the shape of voltage Vac. FIG. 2B shows an example of drain signal V38 of transistor 38. FIG. 2C shows an example of a drain signal V34 of transistor 34. FIG. 2D shows the corresponding shape of voltage Vout. For simplification, a steady state is considered and it is assumed that the load connected to terminals 21 and 22 is neither inductive (no phase shift between voltages Vout and Vac), nor capacitive (lack of smoothing of voltage Vout). Further, the time and amplitude effects of voltage drops in switches in the on state are neglected.

FIGS. 2A to 2D illustrate a particularly simple control of transistors 34 and 38, corresponding to a simple inversion of the signals applied on their gates. During positive halfwaves of voltage Vac, transistor 38 is turned on to turn on thyristor T2. During negative halfwaves of voltage Vac, transistor 34 is turned on to turn on thyristor T1. The control by microcontroller 2 is compatible with a phase angle control of thyristors T1 and T2, enabling adjustment of the output power. In particular, the limitation of the inrush current is obtained by phase-angle controlling thyristors T1 and T2.

It can be seen that the control signals supplied by microcontroller 2 are of same nature, that is, are digital signals. Further, these signals may remain active (i.e., are time-invariant) during the entire period of voltage Vac having the corresponding thyristor assigned thereto (i.e., the corresponding halfwave), and thus do not need to be pulse signals with respect to the frequency of voltage Vac.

For the assembly shown in FIG. 1 to operate properly, auxiliary voltage Vcc has an amplitude at least equal to the sum of voltage Vcc1 used to power the microcontroller, and the voltage Vcc2 set by Zener diode DZ, and the minimum voltage drop in linear regulator 3.

The threshold voltage of Zener diode DZ does not need to be particularly high. It just has to be greater than the voltage drop in resistor 32 or 33 sufficient to impose a current greater than the turn-on current of thyristor T1 or T2, plus the corresponding collector-to-emitter voltage drop in transistor 31 or 35. As a specific embodiment, a Zener diode of a few volts, for example, in the order of 3 volts, may be used. As a variation, Zener diode DZ may be replaced with another regulator.

Auxiliary voltage Vcc may be obtained in several ways. For example, it may be a voltage otherwise available in the electronic device containing the controlled rectifying circuit. According to another example, voltage Vcc is extracted from voltage Vac by means of a switched-mode power supply with a galvanic isolation.

The circuit described in relation with FIG. 1 avoids using conversion elements of an optocoupler or galvanic isolation transformer type to apply the control signals to the thyristors. This considerably simplifies the forming of a controllable rectifying bridge and decreases the cost thereof. Further, the need for a pulse control at a frequency greater than the frequency of voltage Vac such as described in above-mentioned U.S. Pat. No. 9,525,361 is avoided. This avoids risks for the turning on not to occur and simplifies the manufacturing.

It should be noted that it is not disturbing, once thyristor T1 has been turned on, for its anode potential to fall below the potential of terminal 26. Indeed, it remains on until the current that it conducts disappears, that is, until the end of the negative halfwave.

Figure 3:
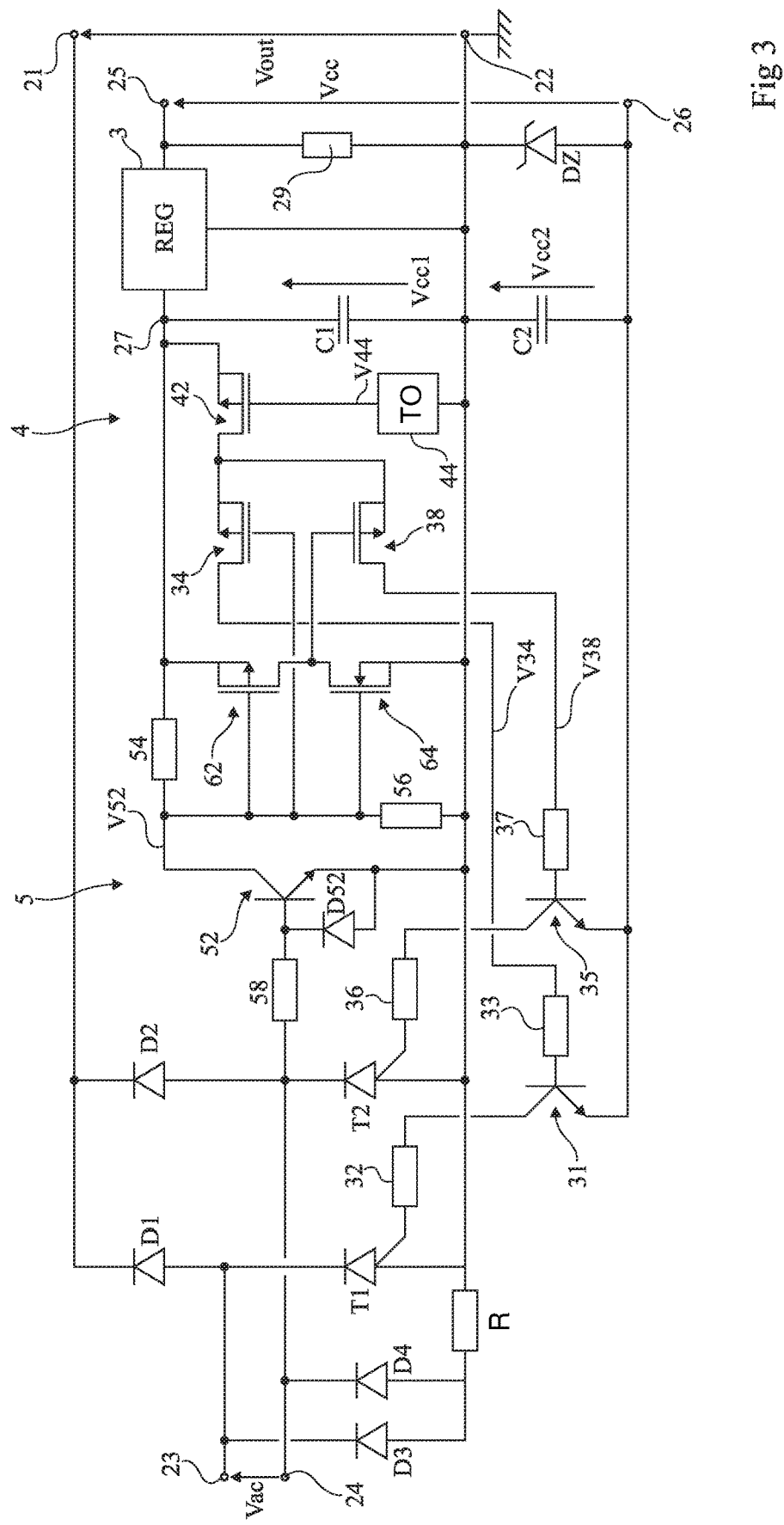
FIG. 3 is a simplified representation, partially in the form of blocks, of another embodiment of a controllable rectifying bridge comprising anode-gate thyristors.

FIG. 3 is a simplified representation, partially in the form of blocks, of another embodiment of a controllable rectifying bridge with anode-gate thyristors T1, T2.

As compared with the assembly of FIG. 1, the microcontroller is replaced with a switching circuit supplying the control signals of the gates of transistors 31 and 35, from a detection of the direction of the halfwave of AC voltage Vac.

Further, FIG. 3 illustrates the case of a mixed bridge, that is, two diodes D3 and D4 respectively couple terminals 23 and 24 to terminal 22 via a resistor R. The function of resistor R is to limit the inrush current at the starting of the system (transient state), that is, before thyristors T1 and T2 are controlled. This variation may also be implemented in the embodiment of FIG. 1.

It also uses the principle of a voltage Vcc applied between two terminals 25 and 26, with a ground 22 of the assembly between the potentials of terminals 25 and 26, and of the use of a voltage regulator 3 and a Zener diode DZ to determine voltages Vcc1 and Vcc2. It also comprises the assemblies with transistors 31 and 35 (with resistors 32, 33, 36, 37). Capacitors C1 and C2 and resistor 29 are also present.

Circuit 4 comprises two P-type MOS transistors 34 and 38, having their respective drains, as in FIG. 1, coupled to resistors 33 and 37. The sources of transistors 34 and 37 are coupled via a starting circuit 4. Circuit 4 comprises a switch 42 (for example, a PMOS) coupling the sources of transistors 34 and 37 to terminal 27. Transistor 42 is controlled by a turn-on (TO) circuit 44, for example, an amplitude detector which detects the end of the transient period to only activate circuit 44 once the inrush current has passed. As long as transistor 42 is not on, the bridge operation is in inrush current limitation by resistor R. A power factor correction circuit which comprises an output capable of controlling a relay shorting resistor R may be used.

In steady state, transistor 42 is on and transistors 34 and 38 are thus powered. The control of transistors 34 and 38 involves detecting the current halfwave of voltage Vac.

To achieve this, a circuit 5 for detecting the direction of the halfwave of voltage Vac is provided. For example, detecting of negative halfwaves is performed with a bipolar transistor 52, for example, of NPN type, having its emitter coupled to the junction point of a resistive divider (resistors 54 and 56 in series) between terminal 27 and terminal 22, having its collector connected to terminal 22, and having its base coupled, by a resistor 58, to terminal 24. The junction point of resistors 54 and 56 (and thus the collector of transistor 52) is connected to the gate of transistor 34. Transistor 52 is on during negative halfwaves of voltage Vac (positive base-emitter voltage), which makes the gate voltage of transistor 34 drop and causes the turning-on thereof (transistor 42 being on in steady state). As for the assembly of FIG. 1, the turning-on of transistor 34 causes, via transistor 31, the turning-on of thyristor T1.

The gate of transistor 38 is connected to the junction point of two MOS transistors 62 and 64, respectively a PMOS and an NMOS, connected between terminals 27 and 22, with their gates being connected to the collector of transistor 52. Transistors 62 and 64 form a push-pull stage, transistor 62 being on when transistor 52 is on and transistor 64 being on when transistor 52 is off. Thus, transistor 38 is turned on during positive halfwaves of voltage Vac (transistor 52 off) since its gate is taken to a low potential (ground 22 to within the voltage drop in transistor 64). In the same way as for the assembly of FIG. 1, the turning-on of transistor 38 causes, via transistor 35, the turning-on of thyristor T2. Preferably, a diode D52 couples the base and the emitter of transistor 52 (anode on the emitter side) to protect the emitter of transistor 52 during positive halfwaves.

Figure 4A:
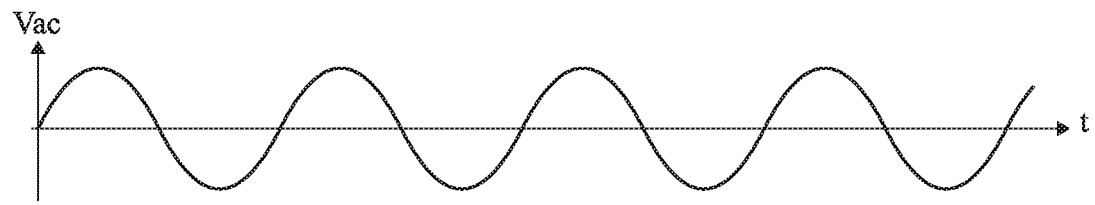
FIGS. 4A, 4B, 4C, 4D, 4E, and 4F illustrate in timing diagrams the operation of the mixed bridge of FIG. 3.
Figure 4B:
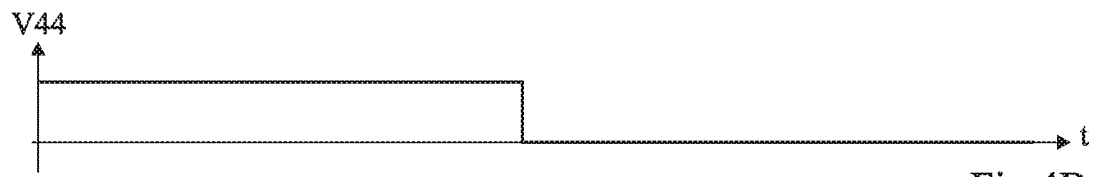
Figure 4C:
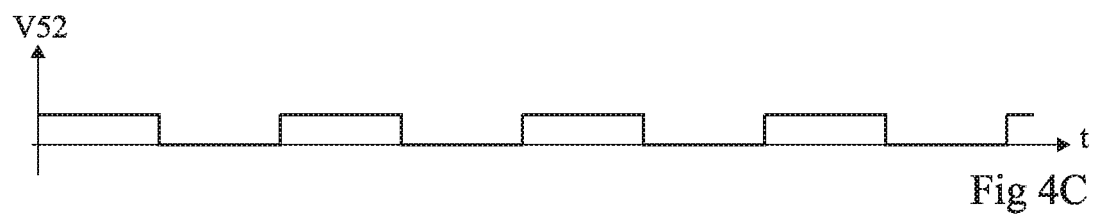
Figure 4D:
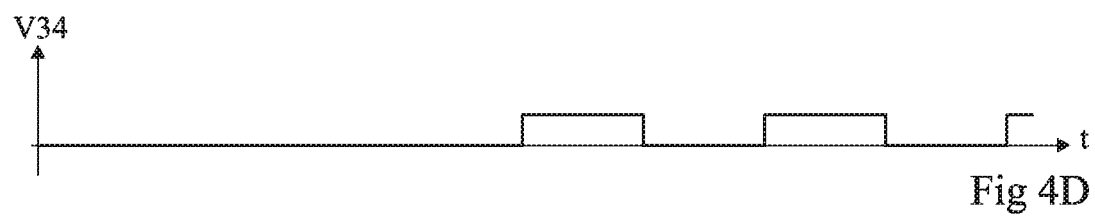
Figure 4E:
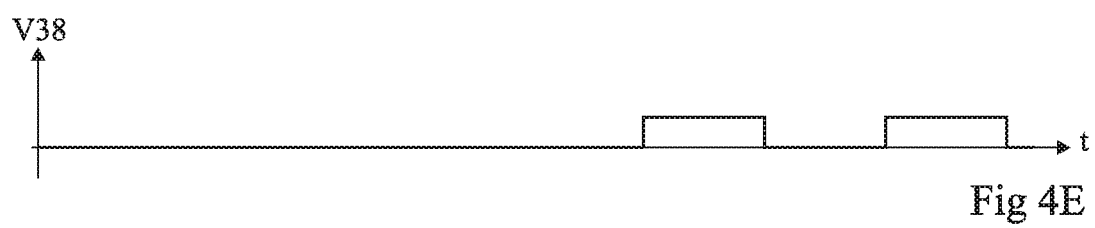
Figure 4F:
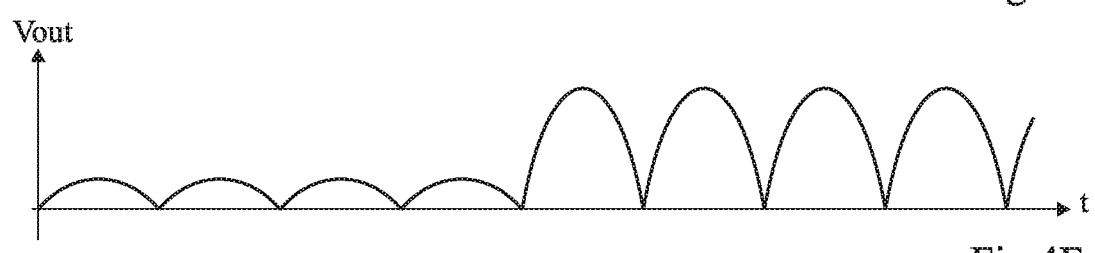

FIGS. 4A, 4B, 4C, 4D, 4E, and 4F illustrate in timing diagrams the operation of the mixed bridge of FIG. 3. FIG. 4A shows an example of the shape of voltage Vac. FIG. 4B shows an example of the shape of signal V44 supplied by circuit 44 for turning on transistor 42. FIG. 4C shows the shape of emitter signal V52 of transistor 52. FIG. 4D shows an example of drain signal V34 of transistor 34. FIG. 4E shows an example of drain signal V38 of transistor 38. FIG. 4F shows the corresponding shape of voltage Vout. In the same way as for FIGS. 2A to 2C, for simplification, a steady state is considered and it is assumed that the load connected to terminals 21 and 22 is neither inductive (no phase shift between voltages Vout and Vac), nor capacitive (lack of smoothing of voltage Vout). Further, the effects in terms of time and amplitude of the voltage drops of the switches in the on state are neglected. FIGS. 4A to 4F illustrate, in their left-hand portion, the operation in transient state (limitation of the inrush current) and, in their right-hand portion, the operation in steady state.

During the transient state, transistor 42 is off (signal V44 in the high state) and transistors 34 and 38 are thus non-conductive independently from AC voltage Vac. Their drains are thus unconnected and transistors 31 and 35 cannot be controlled. The rectification is performed by diode bridge D1, D2, D3, D4 and the current is limited by resistor R.

In steady state, transistor 42 is on and transistors 34 and 38 are thus alternately controlled according to the sign of voltage Vac detected by transistor 52.

An advantage of the assembly of FIG. 3 is that it is particularly simple to form and requires no microcontroller.

Other circuits than circuits 4 and 5 may be provided, and may be provided to effect the described functionalities.

Figure 5:
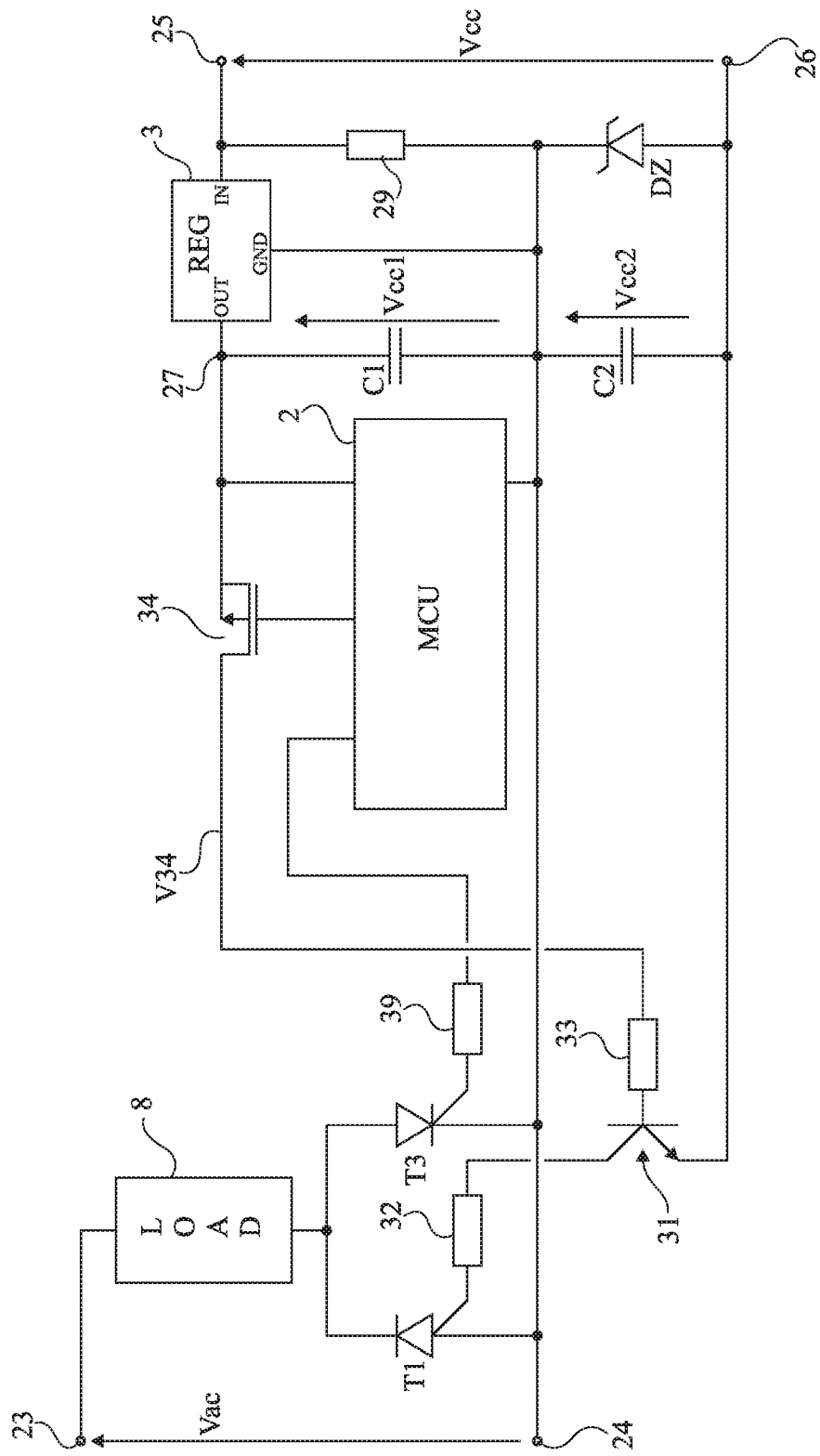
FIG. 5 is a simplified representation, partially in the form of blocks, of an embodiment of an AC load control circuit.

FIG. 5 is a simplified representation, partially in the form of blocks, of an embodiment of an AC load control circuit.

According to this embodiment, a load 8 to be powered under an AC voltage Vac is series-connected with a parallel association of two thyristors T1 and T3, respectively with an anode gate and a cathode gate, between terminals 23 and 24 of application of AC voltage Vac. Load 8 is on the side of terminal 23, and terminal 24 forms the voltage reference (ground 22) of the assembly. The assembly comprises microcontroller 2, regulator 3, and the elements described in relation with FIG. 1, in particular capacitors C1 and C2, Zener diode DZ, and resistor 29. However, cathode-gate thyristor T3, intended to be on during positive halfwaves of voltage Vac, is directly controlled by microcontroller 2, has its gate coupled by a resistor 39 to an output terminal of microcontroller 2. Indeed, since microcontroller 2 has the same voltage reference as the cathode of thyristor T3, it may directly sample therefrom a gate current to turn it on. Transistors 38 and 35 of FIG. 1 and their corresponding assemblies are thus not necessary. Transistor 34 and the assembly of bipolar transistors 31 (base resistor 33 coupled to transistor 34 and collector resistor 32 coupled to the gate of thyristor T1) are, however, required for the control of thyristor T1 during negative halfwaves of voltage Vac. The operation of the rest of the circuit of FIG. 5 can be deduced from the operation discussed in relation with FIG. 1.

An advantage of the described embodiments is that they allow a control of anode-gate thyristors having their anodes interconnected and being powered with an AC voltage.

Another advantage of the described embodiments is that they avoid a pulse control of thyristors with a frequency greater than that of the AC voltage and thus avoid the risk for the thyristor turn-on current not to be reached.

Another advantage of the described embodiments is that they are compatible with an embodiment with no microcontroller.

Various embodiments have been described. Various modifications will occur to those skilled in the art. In particular, bipolar transistors 31 and 35 may be replaced with MOS transistors by way of a few modifications within the abilities of those skilled in the art to take into account the fact that a MOS transistor is voltage-controlled and not current-controlled. In particular, it will be ascertained that the MOS transistors withstand a gate voltage equal to the sum of voltages Vcc1 and Vcc2. Otherwise, the MOS transistors are protected by a Zener diode in parallel with a resistor between the gate and the source of the transistors to limit the gate voltage. Further, the sizing of the different components depends on the application and their determination is within the abilities of those skilled in the art according to the needs of the application. Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of this disclosure. Accordingly, the foregoing description is by way of example only and is not intended to be limiting. The present invention is limited only as defined in the following claims and the equivalents thereto.

The invention claimed is:

1. A circuit for controlling an anode-gate thyristor for rectification of an AC voltage signal, comprising:
a first transistor coupling a gate of the anode-gate thyristor to a first terminal which is at a first potential;
wherein the first potential is lower than a second potential at a second terminal, wherein the second terminal is connected to an anode of the anode-gate thyristor;
a second transistor coupling a control terminal of the first transistor to a third terminal to receive a third potential which is positive with respect to the second potential of the second terminal;
a voltage regulator coupled between the third terminal and a fourth terminal;
a diode having an anode directly electrically connected to the first terminal and a cathode directly electrically connected to the second terminal; and
a resistor directly electrically connected between the second terminal and the fourth terminal.

2. The circuit of claim 1, wherein the fourth and first terminals receive a DC voltage.

3. The circuit of claim 1, wherein the second transistor is controlled by a signal referenced to the second potential of the second terminal.

4. The circuit of claim 1, wherein the second transistor is directly controlled by a microcontroller powered between the third and second terminals.

5. The circuit of claim 1, wherein the second transistor is controlled by a circuit for detecting direction of a halfwave of the AC voltage signal which is applied across the anode-gate thyristor.

6. The circuit of claim 1, wherein the first transistor is a bipolar transistor.

7. The circuit of claim 1, wherein the anode-gate thyristor is a component of a controllable rectifying bridge configured to rectify the AC voltage signal and the second potential is ground.

8. The circuit of claim 7, wherein the controllable rectifying bridge further comprises:
a further anode-gate thyristor;
a third transistor coupling a gate of the further anode-gate thyristor to the first terminal at the first potential; and
wherein the third transistor has a control terminal receiving a control signal which is positive with respect to the first potential of the first terminal, the control signal being time-invariant during an opposite halfwave of the AC voltage signal.

9. A circuit for controlling an AC load connected in series with an anode-gate thyristor between first and second nodes which receive an AC voltage signal, comprising:
a first transistor coupling a gate of the anode-gate thyristor to a first terminal at a first potential, wherein the first potential is lower than a second potential at the second node which is connected to an anode of the anode-gate thyristor;
a second transistor coupling a control terminal of the first transistor to a third terminal to receive a third potential which is positive with respect to the second potential;
a voltage regulator coupled between the third terminal and a fourth terminal;
a diode having an anode directly electrically connected to the first terminal and a cathode directly electrically connected to the second node; and
a resistor directly electrically connected between the second node and the fourth terminal.

10. The circuit of claim 9, wherein the fourth and first terminals receive a DC voltage.

11. The circuit of claim 9, wherein the second transistor is controlled by a signal referenced to the second potential.

12. The circuit of claim 9, wherein the second transistor is directly controlled by a microcontroller powered between the third and second potentials.

13. The circuit of claim 9, wherein the first transistor is a bipolar transistor.

14. A circuit, comprising:
first and second AC terminals receiving an AC voltage signal for rectification;
a first branch comprising:
a first thyristor having a cathode connected to the first AC terminal, an anode connected to a ground node, and a first gate; and
a first transistor having a collector coupled to the first gate, an emitter coupled to a first terminal at a first potential, and a base;
a second transistor coupling the base of the first transistor to a third terminal to receive a third potential which is positive with respect to the ground node; and
a second branch comprising:
a second thyristor having a cathode coupled to the second AC terminal, an anode connected to the ground node, and a second gate;
a third transistor having a collector coupled to the second gate, an emitter coupled to the first terminal at the first potential, and a base;
a voltage regulator coupled between the third terminal and a fourth terminal;
a diode having an anode directly electrically connected to the first terminal and a cathode directly electrically connected to the ground node; and
a resistor directly electrically connected between the ground node and the fourth terminal.

15. The circuit of claim 14, further comprising:
a control transistor having a drain coupled to the base of the third transistor, a source coupled to the third terminal, and a gate.

16. The circuit of claim 15, further comprising a microcontroller powered between the regulator output and ground, the microcontroller configured to generate control signals for application to the gates of the second transistor and the control transistor.

17. A circuit for controlling an anode-gate thyristor for rectification of an AC voltage signal, comprising:
a first transistor coupling a gate of the anode-gate thyristor to a first terminal which is at a first potential;
wherein the first potential is lower than a second potential at a second terminal, wherein the second terminal is connected to an anode of the anode-gate thyristor;
a second transistor coupling a control terminal of the first transistor to a third terminal to receive a third potential which is positive with respect to the second potential of the second terminal;
a voltage regulator coupled between the third terminal and a fourth terminal;
a diode having an anode directly electrically connected to the first terminal and a cathode directly electrically connected to the second terminal; and
a resistor directly electrically connected between the second terminal and the fourth terminal.

18. The circuit of claim 17, wherein the fourth and first terminals receive a DC voltage.

19. The circuit of claim 17, wherein the second transistor is controlled by a signal referenced to the second potential of the second terminal.

20. The circuit of claim 17, wherein the second transistor is directly controlled by a microcontroller powered between the third and second terminals.

21. The circuit of claim 17, wherein the second transistor is controlled by a circuit for detecting direction of a half-wave of the AC voltage signal which is applied across the anode-gate thyristor.

22. The circuit of claim 17, wherein the first transistor is a bipolar transistor.

23. The circuit of claim 17, wherein the anode-gate thyristor is a component of a controllable rectifying bridge configured to rectify the AC voltage signal and the second potential is ground.

24. The circuit of claim 23, wherein the controllable rectifying bridge further comprises:
a further anode-gate thyristor;
a third transistor coupling a gate of the further anode-gate thyristor to the first terminal at the first potential; and
wherein the third transistor has a control terminal receiving a control signal which is positive with respect to the first potential of the first terminal, and wherein the control signal does not pulse multiple times within a single halfwave of the AC voltage signal applied across the anode-gate thyristor.

* * * * *